United States Patent [19]

Kaschig et al.

[11] Patent Number: 4,857,614
[45] Date of Patent: Aug. 15, 1989

[54] RADIATION-SENSITIVE POLYMERS WHICH FORM A METAL COMPLEX, PROCESS FOR THE POLYMERIZATION OF ACETYLENE, AND COATED MATERIAL

[75] Inventors: Jürgen Kaschig; Jürgen Finter, both of Freiburg, Fed. Rep. of Germany

[73] Assignee: Ciba-Geigy Corporation, Ardsley, N.Y.

[21] Appl. No.: 99,374

[22] Filed: Sep. 11, 1987

Related U.S. Application Data

[62] Division of Ser. No. 889,585, Jul. 22, 1986, Pat. No. 4,713,422.

[30] Foreign Application Priority Data

Mar. 23, 1984 [CH] Switzerland ..................... 1467/84

[51] Int. Cl.$^4$ .................... C08F 4/06; C08F 38/00
[52] U.S. Cl. ................................ 526/172; 526/285
[58] Field of Search .................... 526/90, 285, 172

[56] References Cited

U.S. PATENT DOCUMENTS

| | | | |
|---|---|---|---|
| 4,193,297 | 3/1980 | Baumann et al. | 548/521 |
| 4,424,359 | 1/1984 | Kaschig et al. | 526/241 |
| 4,603,185 | 7/1986 | Benton et al. | 526/285 |
| 4,713,422 | 12/1987 | Kaschig et al. | 525/326.7 |

FOREIGN PATENT DOCUMENTS 2556082 11/1974 Fed. Rep. of Germany .
2437418 1/1980 France .

*Primary Examiner*—Joseph L. Schofer
*Assistant Examiner*—Peter F. Kulkosky
*Attorney, Agent, or Firm*—Stephen V. O'Brien

[57] ABSTRACT

Polymers consisting of (a) vinyl compounds having a 2,2'-bipyridyl side group, (b) vinyl compounds having a radiation-sensitive side group and, if appropriate, (c) olefines which differ from (a) and (b), and their complexes with metal compounds, with the exception of alkali metal and alkaline earth metal compounds. They are suitable for coating substrates and for the preparation of photographic relief images. Complexes with cobalt salts are effective catalysts for the polymerization of acetylene.

2 Claims, No Drawings

RADIATION-SENSITIVE POLYMERS WHICH FORM A METAL COMPLEX, PROCESS FOR THE POLYMERIZATION OF ACETYLENE, AND COATED MATERIAL

This is a division of application Ser. No. 889,585, filed on 7/22/86, now U.S. Pat. No. 4,713,422.

The present invention relates to polymers which consist of (a) structural elements containing 2,2'-bipyridyl side groups which can be complexed with metals or metal compounds, and (b) structural elements of an olefine which contains photodimerisable groups and, if appropriate, (c) the structural elements of an olefine which differs from (a) and (b), a process for the polymerisation of acetylene, and a material which is coated with polymers containing 2,2'-bipyridyl groups.

EP-A-No. 0 045 277 describes polymers which contain 2,2'-bipyridyl side groups, and metal complexes of these polymers. Polymers of this type which in addition are radiation-sensitive are not disclosed therein.

The invention relates to polymers which have a mean molecular weight of 1,000 to 5,000,000 and which contain a) 1 to 95 mol % of at least one structural element of the formula I

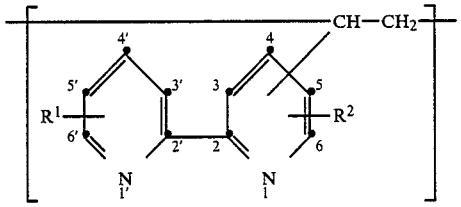

and its complexes with metals or metal compounds with the exception of alkali metals or alkaline earth metals or of alkali metal or alkaline earth metal compounds, wherein the —CH—CH$_2$ group is bonded in the 4- or 6-position, R$^1$ is hydrogen, C$_1$–C$_6$-alkyl, C$_1$–C$_6$-alkoxy, phenyl or phenoxy and R$^2$ is hydrogen or methyl, (b) 99 to 5 mol % of structural elements of at least one olefine which contains a radiation-sensitive group which is bonded to the olefine via a bridging group or directly and possesses a photocrosslinkable ethylenically unsaturated bond, and (c) 0 to 94 mol % of structural elements of at least one olefine which differs from (a) and (b), the percentages being relative to the polymer.

Preferably, the polymer contains 5 to 95 mol %, in particular 10 to 95 mol %, of structural elements of the formula I, 5 to 95 mol %, in particular 5 to 90 mol %, of structural elements (b) and 0 to 90 mol %, preferably 0 to 85 mol %, of structural elements (c). The mean molecular weight is preferably 3,000 to 2,000,000, in particular 5,000 to 1,000,000.

Alkyl and alkoxy groups R$^1$ can be straight-chain or branched, but are preferably straight-chain and have 1–4 C atoms. Examples of suitable alkyl and alkoxy groups are the methyl, ethyl, n-propyl, isopropyl, n-, sec- and tert.-butyl, n-pentyl, 2-pentyl, n-hexyl, methoxy, ethoxy, n-propoxy, isopropoxy, n-butoxy, n-pentyloxy and n-hexyloxy groups.

If the —CH—CH$_2$ group is bonded at the 6- position, R$^1$ is preferably hydrogen and R$^2$ is methyl bonded at the 3-position. However, preferred polymers are those containing structural elements of the formula 1 and their complexes, wherein the —CH—CH$_2$ group is bonded in the 4-position, in particular those in which R$^1$ is hydrogen or is C$_1$–C$_4$-alkyl bonded in the 4'-, 5'- or 6'-position, and R$^2$ is hydrogen or methyl. Particularly preferred polymers are those containing structural elements of the formula I and their complexes, wherein the —CH—CH$_2$ group is bonded in the 4-position and R$^1$ is methyl bonded in the 4'- or 6'-position and R$^2$ is hydrogen, or R$^1$ is hydrogen and R$^2$ is methyl bonded at the 6-position. Very particularly preferred structural elements of the formula I and their complexes are those in which R$^2$ is methyl bonded in the 6-position and R$^1$ is hydrogen, and the —CH—CH$_2$ group is bonded in the 4-position.

Examples of suitable metals for the formation of complexes of the polymers containing structural elements of the formula I are those of main groups IIIa and IVa and sub-groups IVb, Vb, VIb, VIIb, Ib and IIb of the Periodic Table. Suitable metal compounds for the preparation of complexes of the type defined, or in complexes of the type defined, are, in particular, neutral or ionic metal compounds of the abovementioned main groups and subgroups of the Periodic Table, for example salts or acids, it being possible in the case of the salts for the metal to be present both in the anion and in the cation. The metal atom of the complex or of the metal compounds used for its preparation can, if appropriate, also possess other coordinate, covalent or ionic bonds which link it to other ions, atoms or molecules, for example one or more further structural elements of the formula I.

Suitable salts are salts of both inorganic and organic acids, such as halides, in particular chlorides, nitrates, sulfates, phosphates, perchlorates and carboxylates, such as formates, acetates, propionates and stearates; salts which contain a complex anion or cation, for example oxo derivatives of titanium, vanadium, zirconium, molybdenum, hafnium, niobium, tantalum, tungsten and uranium; anionic metal complexes of halide, cyanide, thiocyanate, thiosulfate and orthophosphate ions, such as tetrachloroplatinate, tetrachloropalladate or hexathiocyanatochromate. Examples of salts or complexes of this type are stannyl chloride, lead acetate, copper(I) or (II) chloride, bromide or iodide, copper(II) acetate, nitrate or sulfate, copper(I) cyanide, tetraacetonitrilo copper(I) perchlorate, silver nitrate, zinc chloride, cyanide or thiocyanate, cadmium chloride, cyanide or thiocyanate, mercury iodide or cyanide, zirconium tetrachloride, vanadium(III) chloride, vanadium oxide sulfate, ammonium metavanadate, niobium(V) chloride, tantalum(V) chloride, uranium tetrachloride or -bromide, uranyl nitrate or acetate, chromium-carbonyl, chromium(III) chloride, hexathiocyanatochromate, molybdenum oxytrichloride, molybdenum-carbonyl, tungsten oxytrichloride, tungsten-carbonyl, manganese(II) chloride or iodide, iron(III) nitrate, phosphate, sulfate or acetate, iron(II) or -(III) chloride, ruthenium(III) chloride, potassium pentachlorohydroxyruthenate, dichloro-bis-(2,2'-bi-pyridine)-ruthenium-(II), cobalt(II) chloride, cobalt(II) acetate, nitrate or sulfate, rhodium(II) acetate, rhodium(III) chloride, potassium rhodenium (sic) chloride, nickel(II) acetate, nickel(II) bromide or chloride, nickel(II) sulfate, palladium(II) chloride or iodide, palladium(IV) chloride, palladium acetate, palladium nitrate, potassium tetrachloropalladate, potassium tetrachloroplatinate or potassium hexachloroplatinate.

Preferred complexes are those with metals and metal compounds of the sub groups Ib, IIb, Ivb, VIb, VIIb and VIII, in particular metals and metal compounds of subgroups Ib and VIII. Particularly preferred compounds of the formula I are those which contain iron, ruthenium, cobalt, nickel, palladium, platinum or copper, in particular ruthenium, palladium, platinum or copper, as the complexed central atom. Very particularly preferred complexes are those with cobalt or cobalt salts.

If metal complexes are employed for the preparation of 2,2'-bipyridine complexes according to the invention, in the form of structural elements of the formula I, metal complexes containing at least two readily replaceable ligands which can undergo ligand exchange are preferred. The valence of the metal complexed with the structural element of the formula I is determined by the type of the metal compounds used for the preparation of the complex, or by an oxidation or reduction reaction during or after complex formation.

The bridging group in the structural elements (b) is preferably an ether, thioether, amide or ester group. The photosensitive group is preferably a group containing cinnamate, styryl, styrylpyridinium, chalcone or, in particular, maleinimidyl radicals.

A particularly preferred photosensitive group is a group of the formula II

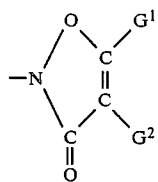

(II)

wherein $G^1$ and $G^2$ independently of one another are alkyl having 1 to 4 C atoms, or together are unsubstituted or substituted tri- or tetramethylene. Examples of alkyl radicals are ethyl, n-propyl, isopropyl, n-butyl, isobutyl and tert.-butyl. $G^1$ and $G^2$ are particularly preferably methyl.

In a preferred embodiment, the structural elements b) are of the formula III

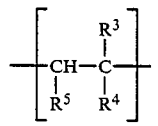

(III)

wherein $R^3$ is a hydrogen atom or methyl and $R^5$ is hydrogen, or $R^3$ is a hydrogen atom and $R^5$ is carboxyl, and $R^4$ is a radical of the formula II which is bonded via a bridging group, or $R^3$ is hydrogen atom and $R^4$ and $R^5$ together form

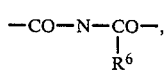

wherein $R^6$ is the radical of the formula II.

The structural elements of the formula III are particularly preferably those of the formulae IIIa to IIIi

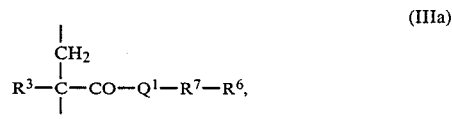
(IIIa)

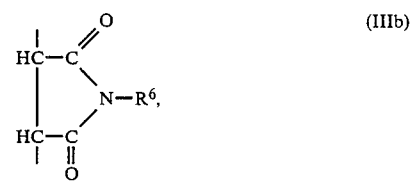
(IIIb)

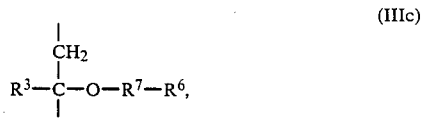
(IIIc)

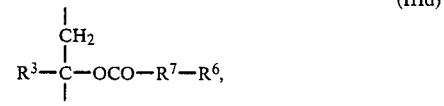
(IIId)

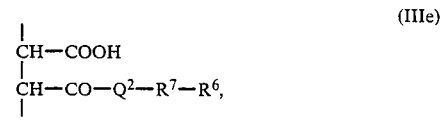
(IIIe)

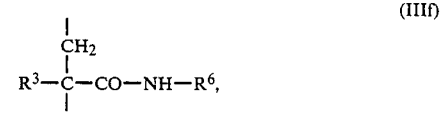
(IIIf)

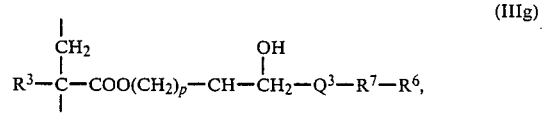
(IIIg)

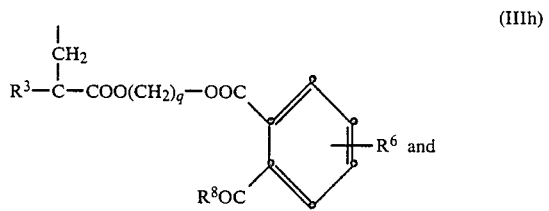
(IIIh)

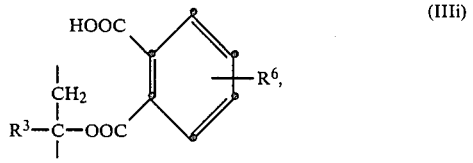
(IIIi)

wherein $Q^1$ is —O—, —S— or —NH—, $Q^2$ is —O—, —S—, —NH— or —NR^3 and $Q^3$ is —OCO—, —O—, —S—, —NH— or —NR^3, $R^3$ is a hydrogen atom or methyl, $R^7$ is straight-chain or branched alkylene having a total of 2 to 23 C atoms and 2 to 13 C atoms in the main chain, cyclopentylene, cyclohexylene, phenylene or —(CH$_2$CH$_2$O—)$_r$CH$_2$CH$_2$—, in which r is an integer from 1 to 5, and $R^6$ is the radical of the formula II, $R^8$ is —OH or —O⊖M⊕, wherein M⊕ is a cation, p is 1 or 2 and q is an integer from 2 to 4.

$Q^1$ is preferably —O— or —NH—, $Q^2$ is preferably —NH— or —NR$^3$ and $Q^3$ is preferably —OCO—, —O—, —NH— or —NR$^3$ $R^7$ preferably contains 2 to 6 C atoms in the main chain. Examples of alkylene radicals $R^7$ are ethylene, 1,2- and 1,3-propylene, 1,2-, 1,3- and 1,4-butylene, 1,2-, 1,3- and 1,5-pentylene, 1,2- and 1,6-hexylene, heptylene, 1,2-, 4,5- and 1,8-octylene, nonylene, 1,2-, 1,3-, 2,3- and 1,10-decylene, undecylene, 1,2-, 2,3-, 4,5- and 1,12dodecylene and tridecylene. Ethylene and 1,2- and 1,3-propylene are preferred.

The structural elements c) can be derived from unsubstituted, or substituted olefines. Preferred structural elements (c) are those of the formula IV

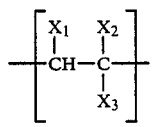
(IV)

wherein $X_1$ is hydrogen, $X_2$ is hydrogen, chlorine or methyl and $X_3$ is hydrogen, methyl, chlorine, —CN, —COOH, —CONH$_2$, phenyl, methylphenyl, methoxyphenyl, cyclohexyl, pyridyl, imidazolyl, pyrrolidyl, —COO-alkyl having 1 to 12 C atoms in the alkyl radical, —COO-phenyl,

—COO—alkylene-OH having 1 to 4 C atoms in the alkylene radical, —OCO-alkyl having 1 to 4 C atoms in the alkyl radical, —OCO-phenyl, —CO-alkyl having 1 to 3 C atoms in the alkyl radical, alkoxy having 1 to 20 C atoms or phenoxy, or $X_2$ is hydrogen and $X_1$ and $X_3$ together form an anhydride group or a —CO-NR'''—CO- group, or are each —COOH or —COO-alkyl having 1 to 6 C atoms in the alkyl radical, R'''being straight-chain or branched $C_1$-$C_{18}$-alkyl, cyclohexyl or phenyl which can be monosubstituted or disubstituted by $C_1$-$C_6$-alkyl, halogen, cyano, nitro and/or $C_1$-$C_3$-alkoxy.

$X_1$ is preferably hydrogen, $X_2$ is preferably hydrogen or methyl, and $X_3$ is preferably CN, CONH$_2$, phenyl, pyridyl, pyrrolidyl, COO-alkylene-OH having 2 to 4 C atoms in the alkylene radical, COO-alkyl having 1 to 12 C atoms in the alkyl radical, or $X_2$ is preferably hydrogen and $X_1$ and $X_3$ are each preferably carboxyl or together form an anhydride group. $X_1$ is particularly preferably hydrogen, $X_2$ is particularly preferably hydrogen or methyl and $X_3$ is particularly preferably phenyl, —COOCH$_3$, COOC$_2$H$_5$, COOCH$_2$CH$_2$OH or —COOCH$_2$CH(C$_2$H$_5$)—(CH$_2$—)$_3$CH$_3$.

Depending on the intended use, some or all of the structural elements of the formula I can be complexed with metals or metal compounds. Preferably, 1 to 95 mol %, in particular 10 to 95 mol % and especially 20 to 95 mol % of the structural elements of formula I are complexed with metals or metal compounds.

In a preferred embodiment, the polymer according to the invention contains repeating structural elements of the formula

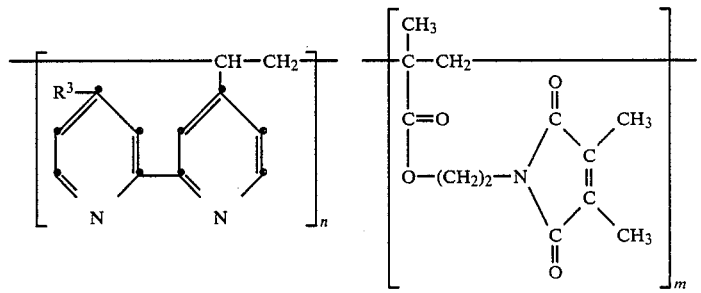

wherein $R^3$ is H or —CH$_3$ and $$\frac{n}{n+m}$$

is 0.5.

The present invention furthermore relates to a process for the preparation of the polymers according to the invention and their complexes, wherein (a) 1 to 95 mol % of a compound of formula V

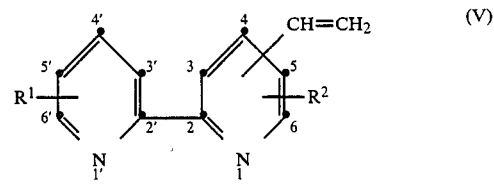
(V)

or a complex of a compound of formula V with metals or metal compound with the exception of alkali metals or alkaline earth metals or alkali metal or alkaline earth metal compounds, wherein $R^1$ and $R^2$ have the meaning given above, (b) 99 to 5 mol % of at least one olefine which contains a photosensitive group which is bonded to the olefine via a bridging group or directly and possesses a photocrosslinkable ethylenically unsaturated bond, and (c) 0 to 94 mol % of at least one olefine which differs from (a) and (b) are polymerized in a manner which is known per se, and, if desired, the polymers obtained are converted to complexes by treatment with metal compounds.

The preparation of the complexes from the non-complexed polymers is described in EP-A No. 0 045 277.

The polymerisation of the monomers can be carried out in a conventional manner, for example in the presence of the usual anionic initiators. Free radical polymerisation is preferred. In this procedure, it is advantageous to use about 0.01 to 5% by weight, preferably 0.01 to 1.5% by weight, relative to the total weight of the monomers, of free radical initiators which are known per se, such as inorganic or organic peroxides or azo compounds, for example hydrogen peroxide, potassium peroxidisulfate, tert.-butyl peroxide, di-tert.-butyl peroxide, pereacetic acid, dibenzoyl peroxide, diacyl peroxides, cumene hydroperoxide, tert.-butyl perbenzoate, tert.-alkyl peroxidicarbonates and $\alpha,\alpha'$-azoisobutyronitrile. The reaction temperatures for the free radical polymerisation are in general between about 30° and 100° C. However, the free radical polymerisation can be carried out at room temperature, for which purpose it is also possible to use redox systems in the abovementioned concentrations, for example mixtures of peroxides, such as hydrogen peroxide, and a reducing agent, such as divalent iron ions. The polymerisation can be carried out in the homogeneous phase, for example in the absence of a solvent or in solution, or in the heterogeneous phase, i.e. as a precipitation polymerisation, emulsion polymerisation or suspension polymerisation. Polymerisation in solution is preferred. Examples of suitable solvents are toluene, N,N-dimethylformamide, N,N-dimethylacetamide and acetonitrile.

The compounds of the formula V and their preparation are described in EP-A-No. 0 045 277. The olefines containing radiation-sensitive groups are likewise known. Maleimidyl compounds are described in, for example, U.S. Pat. No. 4,193,927. The olefines for (c) are well known. Conventional additives can be incorporated into the polymers before, during or after the preparation, examples of these additives being processing auxiliaries, stabilisers and sensitisers. Examples of sensitisers are thioxanthones, as described in German Offenlegungsschrift No. 3,018,891, anthrones, as described in, for example, U.S. Pat. No. 2,670,285, nitro compounds as described in, for example, U.S. Pat. No. 2,610,120, triphenylmethanes, as described in, for example, U.S. Pat. No. 2,690,966, quinones, as described in, for example, U.S. Pat. No. 4,290,966, cyanines, pyrrilium or thiapyrrilium salts, furanones, anthraquinones, thiazoles, thiazolines, naphthothiazolines, Michler's ketone, Michler's thioketone, acetophenones and benzophenones. Depending on the use and the content of radiation-sensitive groups, 0.1 to 20% by weight, relative to the polymer, of a sensitiser can be employed.

The polymers according to the invention are radiation-sensitive and can be photocrosslinked, which renders them insoluble in conventional solvents. This renders superfluous the use of chemical crosslinking agents, such as ethylenically polyunsaturated monomers.

The polymers according to the invention and their complexes can be prepared having virtually any desired mean molecular weights. By using suitable comonomers, tailored polymers can be prepared, i.e. polymers which have a composition and a number of complex-forming or complexed bipyridyl units which are adapted to the specific applications. The polymers, which may or may not be crosslinked, furthermore possess high stability to thermo or chemical decomposition.

Because of the sensitivity to radiation, the polymers according to the invention are suitable for the preparation of protective layers on substrate surfaces, and the physical-mechanical properties and the adhesion can be improved by photocrosslinking.

The polymers according to the invention can also be used for the preparation of photographic relief images. For this purpose, a layer of at least one polymer according to the invention is first applied onto a substrate. The layer thickness can be 0.1 –100$\mu$m, but is preferably 0.8–50 $\mu$m. The present invention likewise relates to the coated material. After the layer has been dried, exposure is carried out through a photomask, after which the unexposed areas are removed by means of a solvent. In this manner, the negative image of the photomask is obtained. The polymers are distinguished by high photosensitivity.

The polymers are advantageously irradiated with electron beams or actinic light, preferably having a wavelength from 200 to 600 nm and an intensity of 150 to 8,000 watt. Examples of suitable light sources are xenon lamps, argon lamps, tungsten lamps, carbon arcs, metal halide lamps and metal arc lamps, such as low pressure, medium pressure and high pressure mercury lamps. Preferably, irradiation is carried out using metal halide or high pressure mercury lamps. The irradiation time depends on various factors, for example on the layer thickness on the substrate, the type of light source and its distance from the irradiated laminate. The irradiation time is, for example, preferably between 1 and 120 seconds.

Preferred organic solvents are polar, in particular polar aprotic, solvents, which can be used alone or in mixtures of at least two solvents. Examples of suitable solvents are ethers, such as diethyl ether, dibutyl ether, tetrahydrofuran, dioxane, methyl ethylene glycol, dimethyl ethylene glycol, dimethyl diethylene glycol, diethyl ethylene glycol, dibutyl diethylene glycol or dimethyltriethylene glycol, halogenated hydrocarbons, such as methylene chloride, chloroform, carbon tetrachloride, 1,2-dichloroethane, 1,1,2-trichloroethane or 1,1,2,2 tetrachloroethane, carboxylates and lactones, such as propylene carbonate, ethyl acetate, methyl propionate, ethyl benzoate, ethylglycol acetate, 2-methoxyethyl acetate, $\gamma$-butyrolactone, $\gamma$-alerolactone and mevalolactone, sulfoxides, such as dimethyl sulfoxide or tetramethylene sulfoxide, sulfones, such as dimethyl sulfone, diethyl sulfone, trimethylene sulfone or tetramethylene sulfone, ketones, such as dimethyl ketone, methyl ethyl ketone, methyl isobutyl ketone or cyclohexanone, substituted benzenes, such as chlorobenzene or nitrobenzene, benzene, methylcyclohexane and aqueous acidic solvents. The coating agents are prepared by dissolving the radiation-sensitive polymers in, for example, the abovementioned solvents. The solids content can be 1 to 70% by weight, preferably 5 to 30% by weight, relative to the solution.

At this stage, further conventional additives can be incorporated, for example fillers, adhesion-promoters which do not have an adverse effect on the action of the initiators, and sensitisers.

The solution is applied onto the substrate by conventional techniques for example immersion, casting, painting, spraying, whirler-coating, with the aid of a slot die or by roller-coating.

Examples of suitable substrates are glass, metals, semiconductors and metal oxides, such as aluminium, aluminium oxide and copper, ceramic, paper and high molecular weight organic materials. Suitable high molecular weight organic materials are natural and synthetic polymers, for example cellulose materials, such as cellulose acetate, cellulose propionates, cellulose butyrate and cellulose ethers, such as methyl cellulose; polymers derived from α,β-unsaturated acids, such as polyacrylates and polymethacrylates, polyacrylamides and polyacrylonitrile; styrene polymers and styrene copolymers, for example styrene/butadiene copolymers and acrylonitrile/butadiene/styrene copolymers; vinyl and vinylidene polymers and their copolymers, such as polyvinyl chloride, polyvinylidene chloride, vinyl chloride/vinylidene chloride copolymers or vinyl chloride/vinyl acetate copolymers; polymers derived from unsaturated alcohols and amines, and derivatives of these polymers, such as polyvinyl alcohol, polyvinyl acetate and poly allyl melamine; crosslinked epoxy resins; polyacetals; polyalkylene oxides and polyphenylene oxides; polyamides, polyimides, polyamide/polyimide block copolymers, polysulfones and polyesters; alkyd resins, for example glycerol/phthalic acid resins and mixtures of these with melamine/formaldehyde resins; and melamine/formaldehyde, urea/formaldehyde and phenol/formaldehyde resins.

Fields of use for the polymers according to the invention are the production of printing plates, printed circuits, soldering masks, letterpress and gravure printing plates and screens. The image areas can be coloured subsequently, in particular with acidic dyes. Image areas of non-complexed polymers can likewise be complexed after exposure, by treatment with solutions of metal compounds. The polymers according to the invention are therefore also suitable for the decoration of surfaces.

The polymers according to the invention, which are preferably radiation-crosslinked and non-complexed can furthermore be used as ion exchangers and for the extraction of metals.

The complexed polymers according to the invention can also be employed as homogeneous or heterogeneous (radiation-crosslinked) catalysts, for example as hydrogenation, isomerisation, acetoxylation or transvinylation catalysts and also as polymerisation catalysts. With these polymers, photostructurable catalyst systems have been made available for the first time.

It is known that cobalt salts catalyse the polymerisation of acetylene [Angew. Makr. Chemie, 295–338 (1982)]. Our own investigations have shown that the catalytic activity is lost if the cobalt salts are complexed with 2,2'-bipyridyl. In contrast, polymers complexed with cobalt compounds and possessing 2,2'-bipyridyl side groups surprisingly again exhibit high catalytic activity.

The invention furthermore relates to a process for the polymerisation of acetylene to polyvinylene under the action of a cobalt catalyst, wherein the cobalt catalyst is a polymer which has a mean molecular weight of 1,000 to 5,000,000 and consists of (a) 1 to 100 mol %, relative to the polymer, of repeating structural elements of the formula I

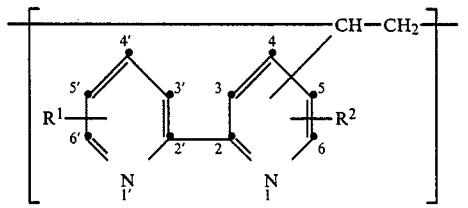

in which $R^1$ is hydrogen, $C_1$-$C_6$-alkyl, $C_1$-$C_6$-alkoxy, phenyl or phenoxy and $R^2$ is hydrogen or methyl, and the —CH—CH$_2$— group is bonded in the 4- or 6-position, which are complexed with a cobalt compound, (b) 0 to 99 mol % of structural elements of at least one olefine which contains a radiation-sensitive group which is bonded to the olefine via a bridging group or directly and possesses a photodimerisable ethylenically unsaturated bond, and (c) 0 to 99 structural elements of at least one olefine which differs from (a) and (b), it being possible for the polymer to be radiation-crosslinked with structural elements (b).

The catalyst can be prepared in situ, prior to the polymerisation. The preparation can be carried out, for example, as follows: a solution of a cobalt salt, if appropriate together with an alkali metal hydride, for example NaBH$_4$, is added to a solution of a polymer having 2,2'-bipyridyl side groups, and the mixture is stirred. The complexed polymer is generally precipitated and can be directly used further or isolated in a known manner.

Particularly suitable cobalt salts are those of divalent cobalt, for example acetates, halides, such as bromides and chlorides, sulfates and, in particular, nitrates. The salts can contain water of crystallisation. Particularly suitable solvents are alcohols, such as ethanols. The concentration is preferably chosen so that the molar ratio of 2,2'-bipyridyl groups to cobalt is 10:1 to 1:1, in particular 5:1 to 1:1.

The polymerisation can be carried out in various ways. For example acetylene gas can be passed into a suspension of the polymeric catalyst, polymerisation of the acetylene being indicated by an intense red colouration. It is also possible to add a saturated solution of acetylene in a suitable solvent, such as ethanol, to the catalyst suspension, while cooling to at least −60° C.

The polyvinylene formed can be isolated in a known manner and used for coating surfaces.

In a preferred embodiment, the polymeric cobalt catalyst is applied as a layer on a substrate surface, for example in a layer thickness of 0.1 to 100 μm. When radiation-sensitive comonomer units are present, the layer can be photocrosslinked or, by irradiation through a photomask and subsequent development with a solvent, can be photostructured. The present invention furthermore relates to a coated material which contains, on a substrate, a layer of a polymer which has a mean molecular weight of 1,000 to 5,000,000 and consists of (a) 1 to 100 mol %, relative to the polymer, of repeating structural units of the formula I

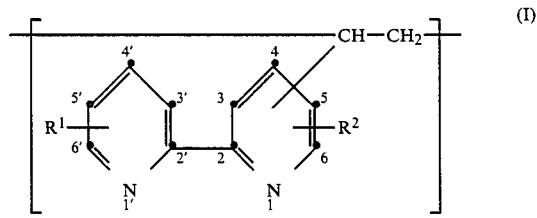

in which $R^1$ is hydrogen, $C_1$-$C_6$-alkyl, $C_1$-$C_6$-alkoxy, phenyl or phenoxy and $R^2$ is hydrogen or methyl, and the —CH—CH$_2$— group is bonded in the 4- or 6-position, which are complexed with a cobalt compound, (b) 0 to 99 mol % of structural elements of at least one olefine which contains a radiation-sensitive group which is bonded to the olefine via a bridging group or directly and possesses a photodimerisable ethylenically unsaturated bond, and (c) 0 to 99 structural elements of at least one olefine which differs from a) and b), it being possible for the polymer to be radiation-crosslinked with structural elements b).

Polyvinylene can be deposited on the coated material by treatment with acetylene. In this way, photostructured polyvinylenes have been made available for the first time. The treatment with acetylene can be carried out by the action of acetylene gas or by immersion in an acetylene solution.

With the deposition of polyvinylene on the surface of the polymeric cobalt catalyst, which surface may or may not be photostructured, it is possible to impart colouration or achieve image intensification by means of the red to black polyacetylene. The polymeric cobalt catalysts are stable and have good adhesion. It is thus possible for polyvinylene layers which may or may not be photostructured to be applied onto a very large variety of substrates.

The polyvinylene layers can be further modified. By doping with oxidising or reducing agents, it is possible to prepare electrically conductive layers or circuit paths. Examples of suitable doping agents are alkali metals, in particular lithium, tetralkylammonium salts, $BF_3$, $SbF_5$, $AsF_5$, $PF_6$, halogens, in particular iodine, $AgClO_4$, $Ag_2SO_4$, $AgSO_3CF_3$ and $AgSO_3F$. Such electrically conductive layers can be used in, for example, the electronics sector.

The Examples which follow illustrate the invention in more detail.

EXAMPLE 1

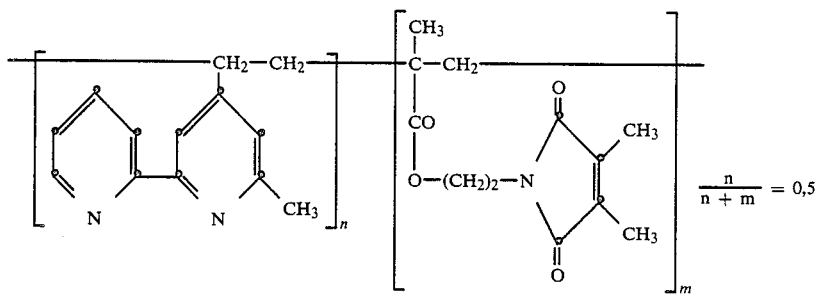

4.5 g of freshly distilled 4-vinyl-6-methyl-2,2'-bipyridine and 5.4 g of dimethylmaleimidyl-2-(methacryloyloxy)ethane are dissolved in 23 ml of N,N-dimethylacetamide, and the solution is treated with a solution of 23 g of azobisisobutyronitrile and 23 ml of N,N-dimethylacetamide in an ampoule flushed with nitrogen. The mixture is heated at 70° C. for 16 hours in the absence of air and light. When the solution is poured into 1 l of diethyl ether, a white powder is obtained. The product is dissolved in 70 ml of tetrahydrofuran, and reprecipitated from 1.5 l of diethyl ether. Yield: 8.0 g (81% of theory). Intrinsic viscosity (chloroform): 0.40 dl/g. Mean molecular weight (light scattering): Mw=255,000. Glass transition temperature: Tg=123° C.

EXAMPLE 2

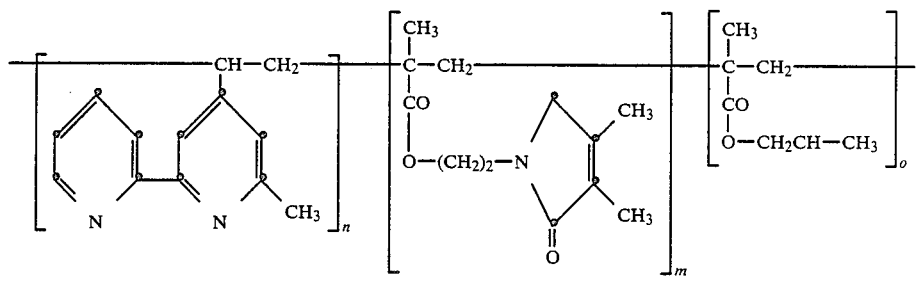

$$\frac{n}{n+m+o} = 0.2; \quad \frac{m}{n+m+o} = 0.35$$

2.94 g of 4-vinyl-6-methyl-2,2'-bipyridine, 6.22 g of dimethylmaleimidyl-2-(methacryloyloxy)-ethane and 4.86 g of 2-hydroxypropyl methacrylate in 50 ml of N,N-dimethylacetamide are copolymerised similarly to Example 1, with the addition of 37 mg of azobisisobutyronitrile. After a reaction time of 20 hours, the highly viscous solution is diluted with 50 ml of tetrahydrofuran, and 1.5 l of diethyl ether are stirred in. Reprecipitation from tetrahydrofuran/ether gives a white pulverulent product. Yield: 11.8 g (84% of theory). Intrinsic viscosity (chloroform): 0.34 dl/g.

| Analysis for $(C_{13}H_{12}N_2)_n(CH_{12}H_{15}NO_4)_m(C_7H_{12}O_3)$ with $\frac{n}{n+m+o} = 0.2$ and $\frac{m}{n+m+o} = 0.35$ | | | | | |
|---|---|---|---|---|---|
| calculated | C | 63.85% | H | 7.03% | N | 5.61% |
| found | C | 63.52% | H | 7.18% | N | 5.51% |

EXAMPLE 3

Polymer complex of poly-[1-(6-methyl-2,2'-bipyrid-4-yl)-ethylene] and cobalt (II) nitrate (Molar ratio bipyridyl groups: CoII=3:1)

2.5 g ($1.27 \cdot 10^{-2}$ mole of repeating units) of poly-[1-(6-methyl-2,2'-bipyrid-4-yl)-ethylene] having a mean molecular weight $M_w$ of 210,000 are dissolved in 100 ml of tetrahydrofuran. A solution of 1.24 g ($4.25 \cdot 10^{-3}$ mole) of cobalt (II) nitrate hexahydrate in 100 ml of tetrahydrofuran is added dropwise at 50° C. The resulting suspension is heated under reflux for 3 hours. After cooling, the precipitate is filtered off under suction, washed thoroughly with tetrahydrofuran and dried for 24 hours at 50° C./1.3 Pa. A pink powder is obtained. Yield: 3.18 g. Degree of swelling (after heating at 50° C. for 15 hours in tetrahydrofuran)=1.6. Analysis for $(C_{13}H_{12}N_2)_{3n}[Co(NO_3)_2]_n(H_2O)_{2.7n}$: Calculated: C 57.10% H 5.09% N 13.66% Co 7.18%; Found: C 57.53% H 5.05% N 13.65% Co 7.09%.

EXAMPLE 4

Polymerisation of acetylene using a cobalt-polymer complex 0.1 g of the polymer complex prepared as described in Example 3 are suspended in 5 ml of ethanol, and the suspension is added to 10 ml of a 0.1% solution of sodium borohydrate in ethanol, under a nitrogen atmosphere, the said solution having been cooled to −80° C. The catalyst suspension obtained is added to an ethanol solution saturated with acetylene at −80° C., and the cooling is discontinued. At −60° C., an intense red colouration is observed and polyvinylene is precipitated.

EXAMPLE 5

Polymerisation of acetylene using a polymer complex prepared in situ 0.277 mole of poly-(6-methyl-4-vinyl-2,2'-bipyridine) is added to a catalyst solution prepared from 0.05 mole of cobalt nitrate and 0.95 mole of sodium borohydride in ethanol/tetrahydrofuran or ethanol/diethyl ether. Polymerisation of acetylene takes place both when acetylene is passed over a liquid film of the catalyst and when acetylene is passed into a catalyst solution.

EXAMPLE 6

Preparation of photocrosslinked catalyst film, and a polyvinylene coating produced with this 6 g of a polymer prepared as described in Example 1, together with 420 mg of thioxanthone, are dissolved in 15 ml of tetrahydrofuran. A polymer film is cast from the solution onto a polyester foil by means of a whirler-coater. After drying in the air at room temperature and drying at 70° C., exposure to a 5,000 W high-pressure Hg lamp is carried out. The foil is then immersed for 10 minutes in a 1% solution of cobalt nitrate hexahydrate in tetrahydrofuran/ethanol (1:1), washed with tetrahydrofuran and then treated for 2 minutes at 0° C. with a 0.1% solution of sodium borohydride in ethanol. The film is exposed to an acetylene gas atmosphere at −10° C. During this procedure, a red colouration is initially produced and brownish black, shiny polyvinylene is precipitated; this, together with the catalyst, gives a firmly adhering layer on the polyester base.

For further characterisation, a strip of film (3 cm×1 cm) is exposed to an iodine atmosphere at 27° C. (72 Pa vapour pressure), and the change in the electrical resistance is measured. During an exposure time of 9 minutes, the electrical resistance decreases from about $10^{10}$ Ohm to $6.2 \cdot 10^4$ Ohm

EXAMPLE 7

Preparation of a relief image 10.0 g of polymer, together with 750 mg of thioxanthone as a sensitiser, are dissolved in 30 ml of ethylene glycol monoethyl ether. This solution is applied on a polyester foil by means of a film-drawing apparatus, and the film is dried in the air at room temperature, dried at 70° C. in a through-circulation drier and then exposed through a negative. (21 Step sensitivity guide from Stouffer, 5,000 W high-pressure Hg lamp from W. Staub). The unexposed image areas are removed by immersion in a solution of 1,1,1-trichloroethane and ethylene glycol monoethyl ether (1:1), and the resulting relief image is dried. The results are shown in the Table below.

| Polymer according to Example | Film thickness in μm | Exposure time in sec | Development time in min | Final step obtained as an image |
|---|---|---|---|---|
| 1 | 5 | 10 | 2 | 8 |
| 1 | 5 | 30 | 2 | 9 |
| 1 | 16 | 10 | 2.5 | 8 |
| 2 | 35 | 15 | 5 | 4 |
| 2 | 16 | 20 | 2 | 6 |
| 2 | 16 | 30 | 2 | 7 |
| 2 | 16 | 40 | 3 | 8 |

EXAMPLE 8

Preparation of an imagewise modified surface from polyvinylene (a) A colourless relief image produced as described in Example 7 is treated in succession with cobalt nitrate and sodium borohydride similarly to Example 6. Thereafter, acetylene is polymerised onto this from the gas phase. A brownish red image is formed.

(b) The polymerisation is initiated on the catalyst-modified polyester surface by immersion in a solution of acetylene in ethanol, saturated at about −40° C. A brownish red image is likewise obtained.

We claim:

1. A process for the polymerization of acetylene to polyvinylene under the action of a cobalt catalyst, wherein the cobalt catalyst is a polymer which has a mean molecular weight of 1,000 to 5,000,000 and consists of:

(a) 1 to 100 mol %, relative to the polymer, of repeating structural elements of the formula I

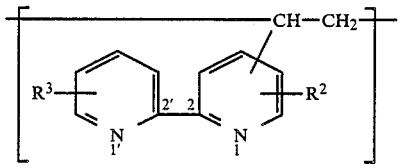 (I)

which are complexed with a cobalt compound, in which $R^1$ is hydrogen, $C_1$-$C_6$-alkyl, $C_1$-$C_6$-alkoxy, phenyl or phenoxy and $R^2$ is hydrogen or methyl and the —CH—CH$_2$— group is bonded in the 4- or 6-position, (b) 0 to 99 mol % of structural elements of at least one olefin which contains a radiation-sensitive group which is bonded to the olefin directly or via a bridging group and possesses a photodimerizable ethylenically unsaturated bond, and (c) 0 to 99 mol % of structural elements with at least one olefin which differs from (a) and (b).

2. The process of claim 1, wherein the polymer is radiation-crosslinked with structural elements (b).

* * * * *